(12) United States Patent
Kaiser et al.

(10) Patent No.: US 6,552,549 B1
(45) Date of Patent: Apr. 22, 2003

(54) METHOD OF READING ELECTRICAL FUSES/ANTIFUSES

(75) Inventors: Robert Kaiser, Kaufering (DE); Jürgen Lindolf, Friedberg (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/867,253

(22) Filed: May 29, 2001

(30) Foreign Application Priority Data

May 26, 2000 (DE) .......................................... 100 26 243

(51) Int. Cl.[7] .............................................. G01R 31/02
(52) U.S. Cl. ...................... 324/550; 324/509; 365/225.7
(58) Field of Search ................................. 324/509, 510, 324/511, 550; 365/94, 96, 225.7

(56) References Cited

U.S. PATENT DOCUMENTS

| | | | |
|---|---|---|---|
| 4,654,830 A | * 3/1987 | Chua et al. ................. | 365/200 |
| 5,208,780 A | * 5/1993 | Iwase et al. ............. | 365/225.7 |
| 5,299,150 A | * 3/1994 | Galbraith et al. ........... | 257/528 |
| 5,724,282 A | 3/1998 | Loughmiller et al. | |

FOREIGN PATENT DOCUMENTS

JP          09017872 A          1/1997

* cited by examiner

Primary Examiner—N. Le
Assistant Examiner—Vincent Q. Nguyen
(74) Attorney, Agent, or Firm—Laurence A. Greenberg; Werner H. Stemer; Ralph E. Locher

(57) ABSTRACT

Electrical fuses/antifuses in a semiconductor memory configuration, such as in particular a DRAM, are read, instead of with the previously conventional internal voltage, with the voltage that defines the high potential of the bit lines of a memory cell array in the semiconductor memory. The high potential of the bit lines is defined by a voltage that is reduced relative to the internal voltage of the semiconductor memory.

4 Claims, 1 Drawing Sheet

$V_{int} > V_{blh}$

METHOD OF READING ELECTRICAL FUSES/ANTIFUSES

BACKGROUND OF THE INVENTION

Field of the Invention

The invention lies in the semiconductor technology field. More specifically, the present invention relates to a method of reading electrical fuses/antifuses (fuses are electrical breakdown paths or fusible links) in a semiconductor memory configuration, in which the state of a fuse/antifuse is read by applying a voltage to the fuse/antifuse. In the semiconductor memory configuration the high potential of bit lines of a memory cell array is defined by a voltage $V_{blh}$ which is reduced with respect to an internal voltage $V_{int}$ of the semiconductor memory configuration.

In integrated circuits, such as in particular in semiconductor memory configurations, electrically burnable fuses/antifuses are being used to an increasing extent. These are capable in each case either of being switched on (antifuse) or switched off (fuse) by burning. A fuse that can be switched off by burning is severed by the burning operation and is also referred to as a normal "Efuse". On the other hand, a fuse that can be switched on by burning is switched on by the burning operation and is referred to as an "antifuse". Such an antifuse is also rendered conductive by the burning. In the following text, "fuse" is to be understood to mean both an "Efuse" and an "antifuse" (given appropriate reversal of the result of the burning operation).

Referring now to FIGS. 2 and 3, there is shown a fuse configuration 1 having different fuses 2 which are located between terminals 3, 4. If, then, such fuses, "Efuses" in the present case, are burned, then the electrical connection between the terminals 3 and 4 is interrupted, as indicated schematically for two of the fuses 2 in FIG. 3. This burning can be carried out by applying appropriately high electrical voltages between respective terminals 3, 4 or as a result of the action of a laser beam.

At present, fuses are mainly read with the aid of the so-called internal chip voltage $V_{int}$, which is available in the chip of each semiconductor memory configuration and is about 2 V, or with the aid of the external supply voltage Vdd. FIG. 4 shows a circuit configuration suitable for this purpose, with which the individual terminals 3 of the fuse configuration 1 can be supplied with the internal chip voltage Vint via switches. If a fuse is nonconductive, that is to say burned, then this can be assessed as a logic state "1" (or "0"). If, on the other hand, a fuse is conductive, that is to say not burned, this is then determined as a "0" state (or "1".

We have now for the first time discovered that reading fuses by means of the internal chip voltage $V_{int}$, which is of the order of magnitude of 2 V, can lead to problems: this is because the application of such a high voltage has the effect of a relatively rapid aging process and in this way can ultimately even bring about inadvertent burning of previously unburned fuses.

SUMMARY OF THE INVENTION

The object of the present invention is to provide a method of reading electrical fuses and/or antifuses which overcomes the It above-noted deficiencies and disadvantages of the prior art devices and methods of this general kind, and in which rapid aging processes and inadvertent burning of previously unburned fuses/antifuses are reliably avoided.

With the above and other objects in view there is provided, in accordance with the invention, a method of reading electrical fuses/antifuses in a semiconductor memory configuration, which comprises:

providing a semiconductor memory configuration with fuses/antifuses and with a memory cell array having bit lines, the semiconductor memory having a given internal voltage and a high potential of the bit lines defined by a reduced voltage having a level below the given internal voltage; and reading a state of a fuse/antifuse by applying the reduced voltage defining the high potential of the bit lines of the memory cell array.

In other words, the object of the invention is achieved in that the fuses/antifuses are read by applying the reduced voltage $V_{blh}$.

The terms fuses/antifuses and fuse/antifuse are to be understood as inclusive alternatives. The novel method is thus defined for reading fuses and/or antifuses and for semiconductor memory devices which are provided exclusively with fuses or antifuses.

In accordance with an added feature of the invention, the reduced voltage is reduced by approximately 20 to 30% with respect to the internal voltage.

In accordance with a concomitant feature of the invention, the internal voltage is set to about 2 V and the reduced voltage is set to about 1.6 V.

In semiconductor memory configurations, such as DRAMs, the high potential of the bit lines, as is known, is defined by the voltage $V_{blh}$. This voltage $V_{blh}$ is about 1.6 V and is therefore reduced by 20 to 30% with respect to the internal chip voltage $V_{int}$. If, then, instead of the previously conventional internal chip voltage $V_{int}$, the reduced voltage $V_{blh}$ that defines the high potential of the bit lines is used to read the fuses/antifuses, then because of the voltage reduction from about 2 V to about 1.6 V that is effected as a result, the average lifetime of the fuses (Efuses and antifuses) can be increased by about 1.6 decades, that is to say by a factor 16, as trials by the inventors have shown.

This considerable increase in the lifetime as a result of a relatively slight reduction in the read voltage of the fuses/antifuses is completely surprising and could not be foreseen; this is because the relatively slight reduction in the reading voltage by 20 to 30% allows an increase in the lifetime by 1.6 decades, that is to say 1600%, to be achieved. With reference to this increase in the lifetime, the invention has proven to be even more advantageous for antifuses than for Efuses.

Other features which are considered as characteristic for the invention are set forth in the appended claims.

Although the invention is illustrated and described herein as embodied in a method of reading electrical fuses/antifuses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages am thereof will be best understood from the following description of specific embodiments when read in connection with the accompanying drawings.

DESCRIPTION OF THE PREFERRED EMBODIMENTS

Figure 2:
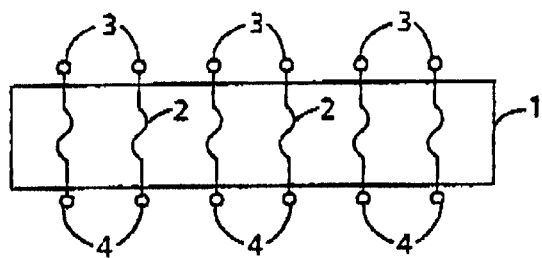
FIG. 2 is a schematic illustration of a fuse configuration.
Figure 3:
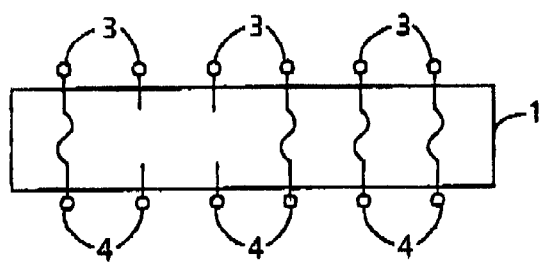
FIG. 3 is a schematic illustration of the fuse configuration of FIG. 2, with some fuses having been severed.
Figure 4:
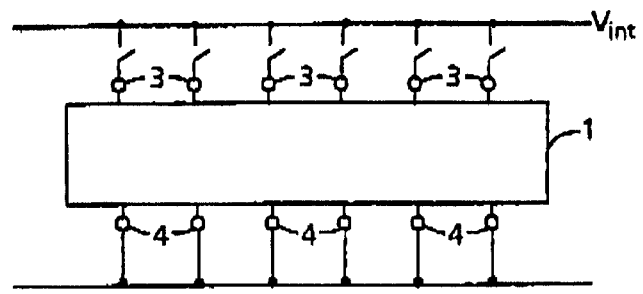
FIG. 4 is a schematic illustration of a circuit configuration which is suitable for reading the fuse configuration of FIG. 2 or 3.

Reference is had to the introductory text, where FIGS. 2 to 4 are described. In the figures, the same reference symbols are used in each case for mutually corresponding components.

Figure 1:
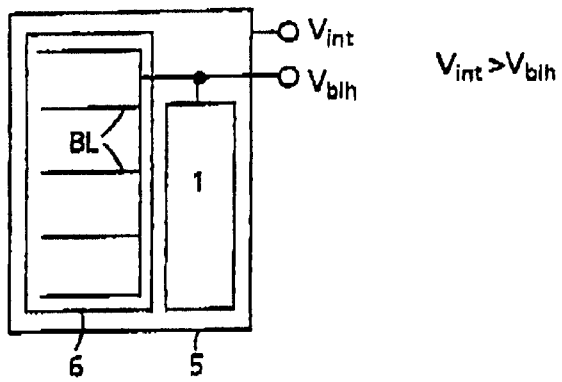
FIG. 1 is a schematic illustration of a semiconductor chip with a fuse configuration and a memory cell array.

Referring now to the figures concerning the invention in detail, FIG. 1 shows a semiconductor chip 5 having a fuse configuration 1 and a memory cell array 6 with bit lines BL. The semiconductor chip 5 has an internal chip voltage $V_{int}$, which is about 2 V. The internal chip voltage $V_{int}$ has hitherto been used, inter alia, to read the fuses in the fuse configuration 1.

The bit lines BL can be supplied with a voltage $V_{blh}$, which is about 1.6 V and which defines the high potential of these bit lines BL.

According to the invention, the voltage $V_{blh}$ is now also used to read the fuses in the fuse configuration 1. As a result of the relatively low reduction in the read voltage from the internal chip voltage $V_{int}$ to the voltage $V_{blh}$ defining the high potential of the bit lines BL, a considerable increase in the lifetime of the fuses in the fuse configuration 1, of about 1.5 decades, that is to say by a factor 16, can be achieved. In this case, the voltage $V_{blh}$ is still sufficiently high to ensure the reliable reading or assessment of the state of the individual fuses 2.

We claim:

1. A method of reading electrical fuses/antifuses in a semiconductor memory configuration, which comprises:

providing a semiconductor memory configuration with fuses/antifuses and with a memory cell array having bit lines, the semiconductor memory having a given internal voltage and a high potential of the bit lines defined by a reduced voltage, the reduced voltage being less than the given internal voltage and having a voltage level below the given internal voltage; and reading a state of a fuse/antifuse by applying the reduced voltage thereto.

2. The method according to claim 1, which comprises configuring the reduced voltage to be approximately 20 to 30% less than the internal voltage.

3. The method according to claim 1, which comprises setting the internal voltage to about 2 V and setting the reduced voltage to about 1.6 V.

4. The method according to claim 1, wherein the reduced voltage is approximately 20 to 30% less than the internal voltage.

* * * * *